US011363695B2

(12) United States Patent
Veenstra

(10) Patent No.: US 11,363,695 B2
(45) Date of Patent: Jun. 14, 2022

(54) FLASHING LAMP CIRCUIT

(71) Applicant: Innotec, Corp., Zeeland, MI (US)

(72) Inventor: Thomas J. Veenstra, Lakewood, CO (US)

(73) Assignee: Innotec, Corp., Zeeland, MI (US)

( * ) Notice: Subject to any disclaimer, the term of this patent is extended or adjusted under 35 U.S.C. 154(b) by 24 days.

(21) Appl. No.: 16/757,797

(22) PCT Filed: Nov. 14, 2018

(86) PCT No.: PCT/US2018/060935
§ 371 (c)(1),
(2) Date: Apr. 21, 2020

(87) PCT Pub. No.: WO2019/099455
PCT Pub. Date: May 23, 2019

(65) Prior Publication Data
US 2021/0307144 A1 Sep. 30, 2021

Related U.S. Application Data

(60) Provisional application No. 62/586,281, filed on Nov. 15, 2017.

(51) Int. Cl.
| | |
|---|---|
| *H05B 45/30* | (2020.01) |
| *H03K 3/281* | (2006.01) |
| *H05B 45/46* | (2020.01) |
| *H03K 3/282* | (2006.01) |
| *H05B 45/32* | (2020.01) |
| *H05B 45/395* | (2020.01) |

(52) U.S. Cl.
CPC .......... *H05B 45/46* (2020.01); *H03K 3/2823* (2013.01); *H05B 45/30* (2020.01); *H05B 45/32* (2020.01); *H05B 45/395* (2020.01)

(58) Field of Classification Search
CPC ........ H05B 39/09; H05B 41/30; H05B 45/00; H05B 45/30; H05B 45/395; H05B 45/46; H05B 45/10; H03K 3/2823; H03K 17/615; H03K 3/281
See application file for complete search history.

(56) References Cited

U.S. PATENT DOCUMENTS

| | | | | |
|---|---|---|---|---|
| 3,039,065 A | * | 6/1962 | Regis ................... | H03K 3/2823 331/113 R |
| 3,421,108 A | * | 1/1969 | Keller .................. | H03K 3/2823 331/113 R |
| 3,911,373 A | * | 10/1975 | Ohtake ................ | H03K 3/2823 331/65 |
| 4,572,288 A | | 2/1986 | Kinley | |

(Continued)

OTHER PUBLICATIONS

International Search Report and Written Opinion from PCT/US2018/060935 dated Jan. 24, 2019.

(Continued)

*Primary Examiner* — Thai Pham
(74) *Attorney, Agent, or Firm* — Warner Norcross + Judd LLP

(57) ABSTRACT

The specification discloses a flashing lamp circuit including (1) at least one LED, (2) a dual-BJT astable multivibrator, and (3) a BJT/MOSFET pair that functions as both (a) a switch between the multivibrator and the lamp and (b) a current regulator for the at least one LED.

5 Claims, 6 Drawing Sheets

(56) References Cited

U.S. PATENT DOCUMENTS

| | | | |
|---|---|---|---|
| 4,692,718 A | 9/1987 | Roza et al. | |
| 5,313,187 A | 5/1994 | Choi et al. | |
| 7,030,599 B2 | 4/2006 | Douglas | |
| 7,714,812 B2 * | 5/2010 | Dou | H05B 45/395 345/76 |
| 8,618,744 B2 * | 12/2013 | Briggs | H05B 47/175 315/294 |
| 8,638,044 B2 | 1/2014 | Briggs | |
| 2006/0061301 A1 * | 3/2006 | Ito | H05B 45/3725 315/291 |
| 2013/0002205 A1 | 1/2013 | Tang | |

OTHER PUBLICATIONS

"Blinking LED Circuit with Schematics and Explanation," https://www.build-electronic-circuits.com/blinking-led-circuit/(Published Feb. 26, 2017).

"Astable Multivibrator," https://electronics-tutorials.ws/waveforms/astable.html (Published no later than Dec. 29, 2017).

* cited by examiner

FLASHING LAMP CIRCUIT

BACKGROUND OF THE INVENTION

The present invention relates to lamp or lighting circuits, and more particularly to flashing lamp or lighting circuits.

Numerous circuits and methods are known and used to provide flashing lamps and/or the functionality of flashing lamps. Examples of such circuits and methods include those that use microcontrollers, 555 timers, and motors with rotating reflectors. Nevertheless, there continues to be a need for flashing lamp circuits of improved efficiency and reduced cost.

SUMMARY OF THE INVENTION

The present invention provides a flashing lamp circuit of improved efficiency and reduced cost. The circuit includes (1) a dual BJT (bipolar junction transistor) astable multivibrator and (2) a BJT/MOSFET (metal-oxide-semiconductor field-effect transistor) pair that function as both a switch and a current regulator for a light source, such as one or more LEDs.

The present invention provides a relatively low-cost solution for a flashing lamp or light system. The circuit may be used for driving a flashing LED lamp, for example, in a flashing beacon light. One example application of such a system is for use as a warning or indicator light on a vehicle and other piece of equipment.

These and other advantages and features will be more fully understood and appreciated by reference to the descriptions of the current embodiments and the drawings.

DESCRIPTION OF THE CURRENT EMBODIMENTS

Figure 1:
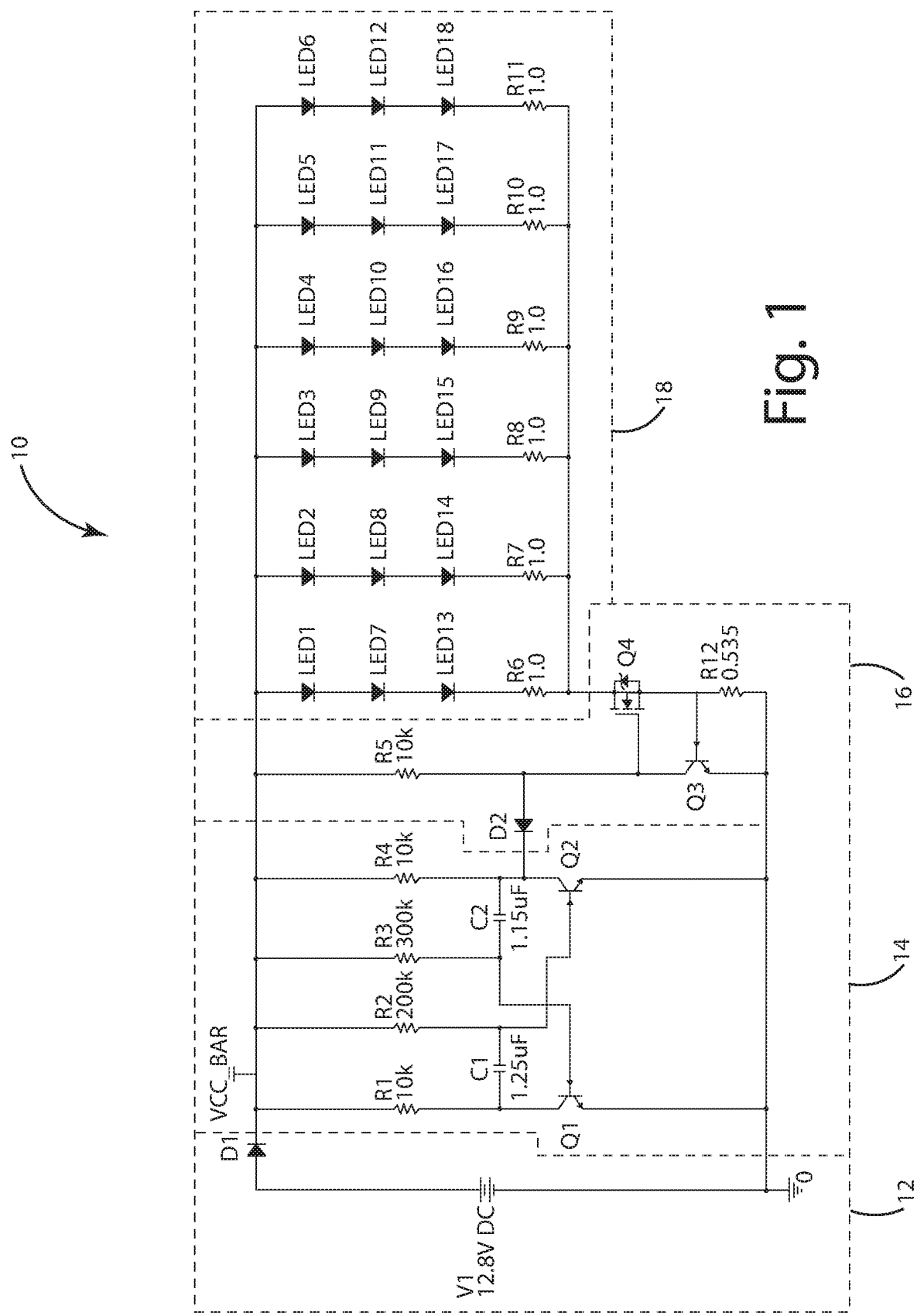
FIG. 1 is a schematic diagram of a flashing lamp circuit in accordance with a current embodiment of the present invention.

Before the embodiments of the invention are explained, it is to be understood that the invention is not limited to the details of operation or to the details of construction; and the arrangement of the components set forth in the following description or illustrated in the drawings. The invention may be implemented in various other embodiments and may be practiced or carried out in alternative ways not expressly disclosed herein.

In addition, it is to be understood that the phraseology and terminology used herein are for the purpose of description and should not be regarded as limiting. The use of "including" and "comprising" and variations thereof encompasses the items listed thereafter and equivalents thereof as well as additional items and equivalents thereof. Further, enumeration may be used in the description of various embodiments. Unless otherwise expressly stated, the use of enumeration should not be construed as limiting the invention to any specific order or number of components. Nor should the use of enumeration be construed as excluding from the scope of the invention any additional steps or components that might be combined with or into the enumerated steps or components. Any reference to claim elements as "at least one of X, Y, and Z" is meant to include any one or more of X, Y, or Z individually, and any combination of any one or more of X, Y, and Z, for example, X, Y, Z; X, Y; X, Z; and Y, Z.

Directional terms, such as "vertical," "horizontal," "top," "bottom," "upper," "lower," "inner," "inwardly," "outer" and "outwardly," are used to assist in describing the invention based on the orientation of the embodiments shown in the illustrations. The use of directional terms should not be interpreted to limit the invention to any specific orientation(s).

A flashing lamp circuit constructed in accordance with a current embodiment of the invention is illustrated in FIG. 1 and generally designated 10. The circuit 10 is adapted to be connected to a power supply circuit 12. The circuit 10 includes a dual-BJT astable multivibrator 14, a switch/regulator portion 16, and a lamp portion 18.

The power supply circuit 12 (see FIG. 1) is of conventional design and includes a voltage source V1 and a diode D1. The voltage source may be, for example, a battery or the power circuit of a vehicle. The flashing lamp circuit 10 is designed for use with a nominal 12-volt power supply. The power supply 12 may be virtually any DC (direct current) power supply. The design of the flashing lamp circuit 10 for a different power supply would be known to those skilled in the art.

Figure 2:
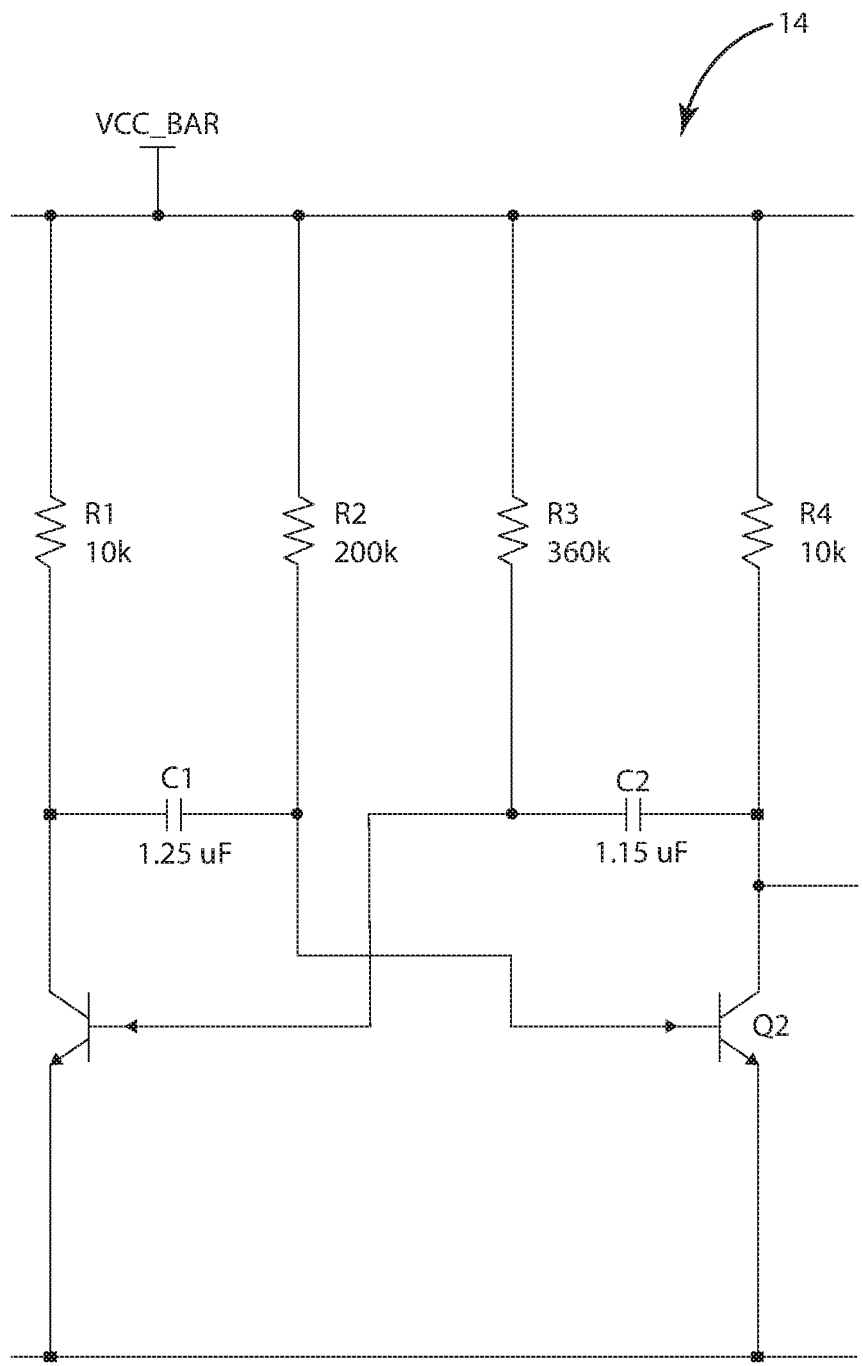
FIG. 2 is a schematic diagram of the dual BJT astable multivibrator portion.

The flashing function of the flashing lamp circuit 10 is provided by the dual-BJT (bipolar junction transistor) astable multivibrator 14 (see FIGS. 1-2). The multivibrator 14 is of a design that is known and will be recognized by those skilled in the art. The multivibrator includes BJTs Q1 and Q2, capacitors C1 and C2, and resistors R1 through R4.

Figure 3:
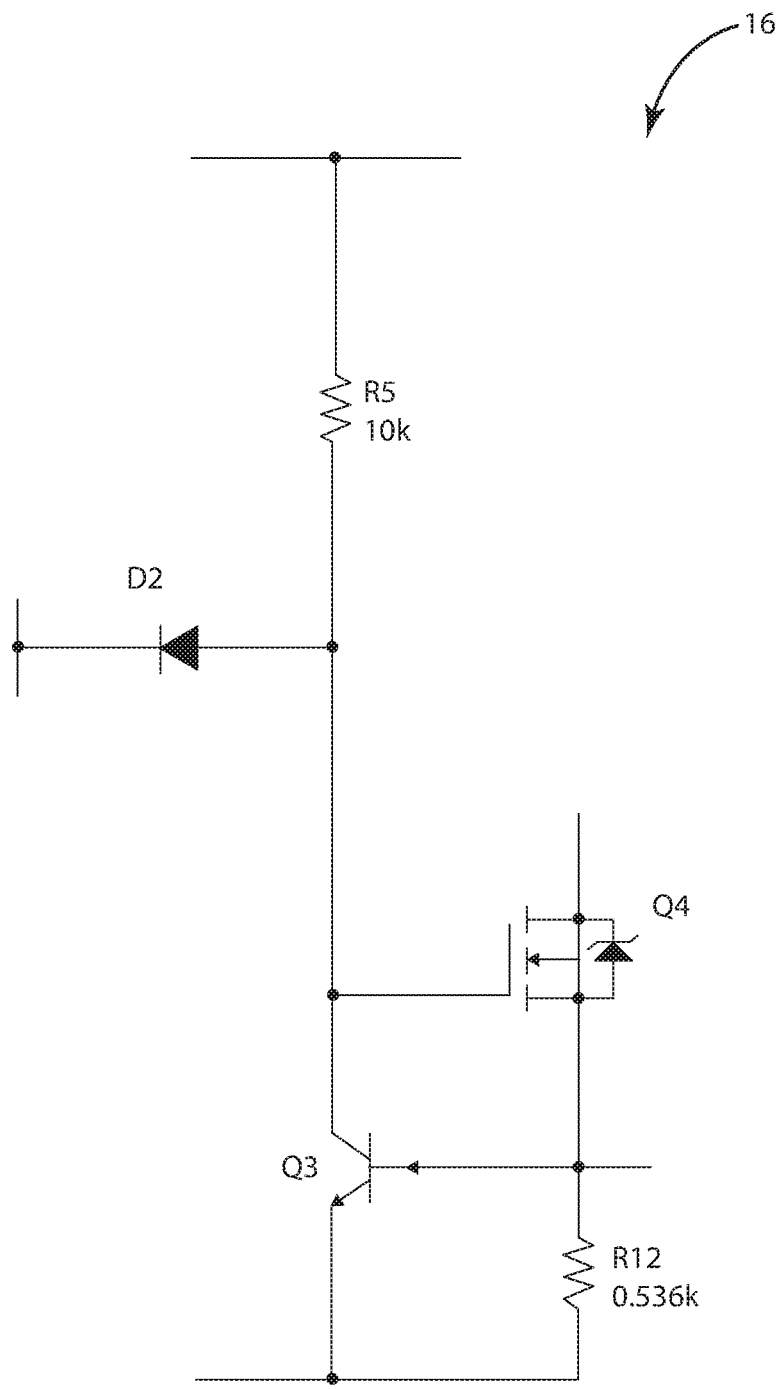
FIG. 3 is a schematic diagram of the on/off amplification switch and current regulator portion.

The switch/regulator portion 16 is illustrated in FIGS. 1 and 3. The circuit portion 16 includes a BJT Q3, a MOSFET Q4, resistors R5 and R12, and a diode D2. The MOSFET Q4 is, and operates as, a dual-function component. The MOSFET Q4 is both (1) an amplifier switch between the multivibrator 14 and the LED lamp portion 18 and (2) a constant current regulator for the LED lamp portion. More specifically, because the gate of the MOSFET Q4 is coupled back to the multivibrator 14, the MOSFET Q4 acts as both (1) an on/off switch for blinking and (2) a constant current regulator for the LEDs.

Figure 4:
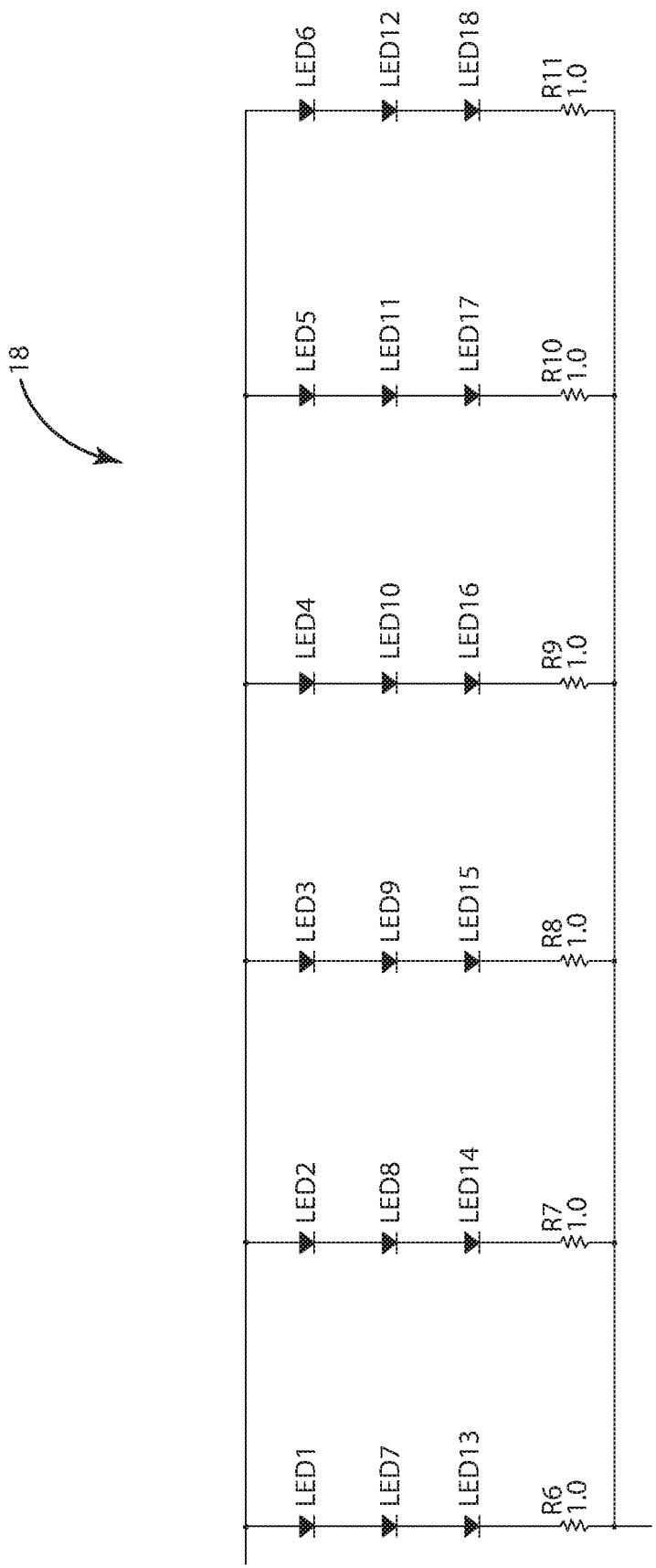
FIG. 4 is a schematic diagram of the LED lamp portion.

The LED lamp portion 18 is illustrated in FIGS. 1 and 4. The lamp portion 18 is of a design that is known to those skilled in the art. The illustrated embodiment includes eighteen LEDs LED1 through LED18. The LEDs are arranged in sets of three, with each set connected in series with one of the resistors R6 through R11.

Figure 5:
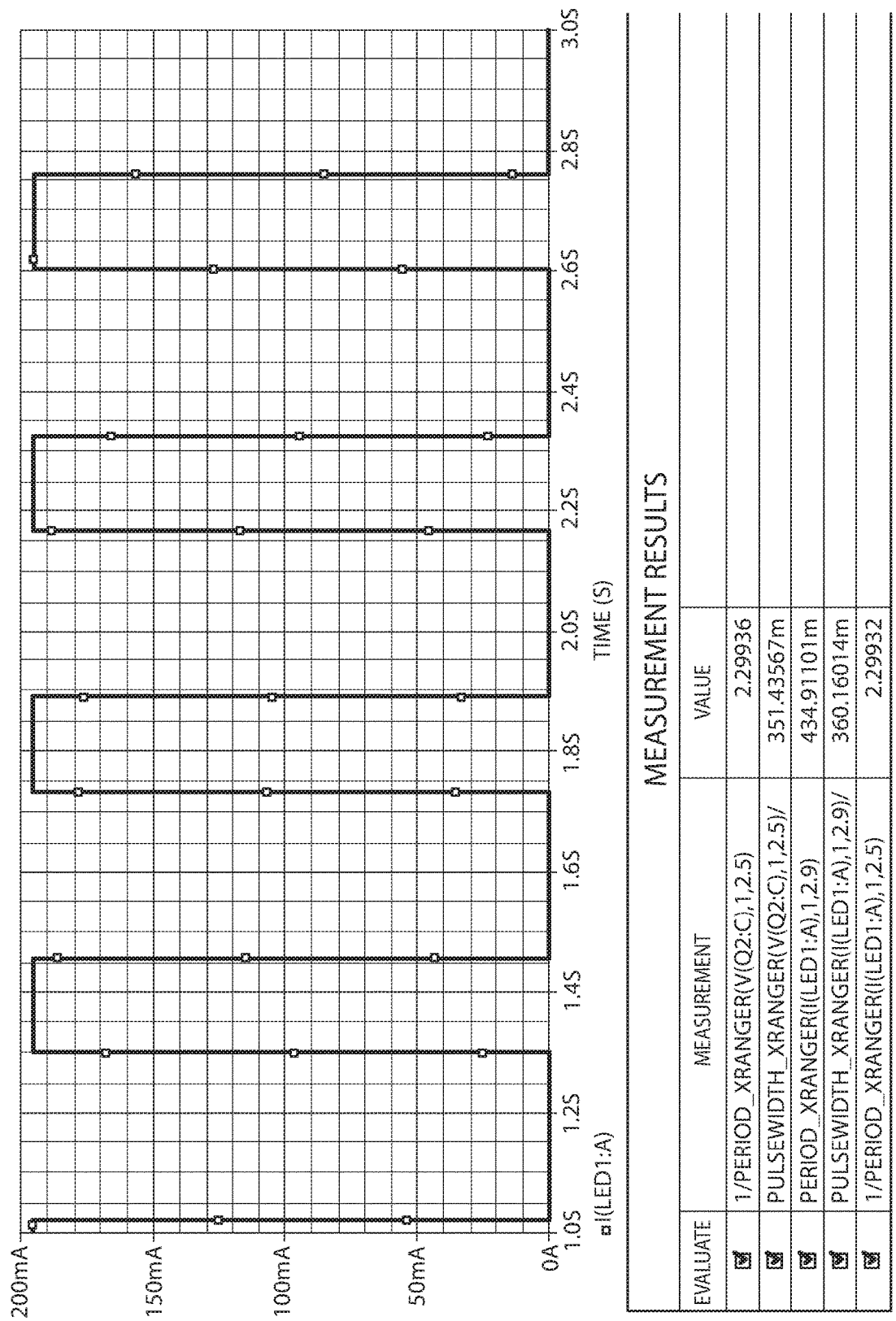
FIG. 5 is a graph illustrating the frequency and the duty cycle produced by the flashing lamp circuit.
Figure 6:
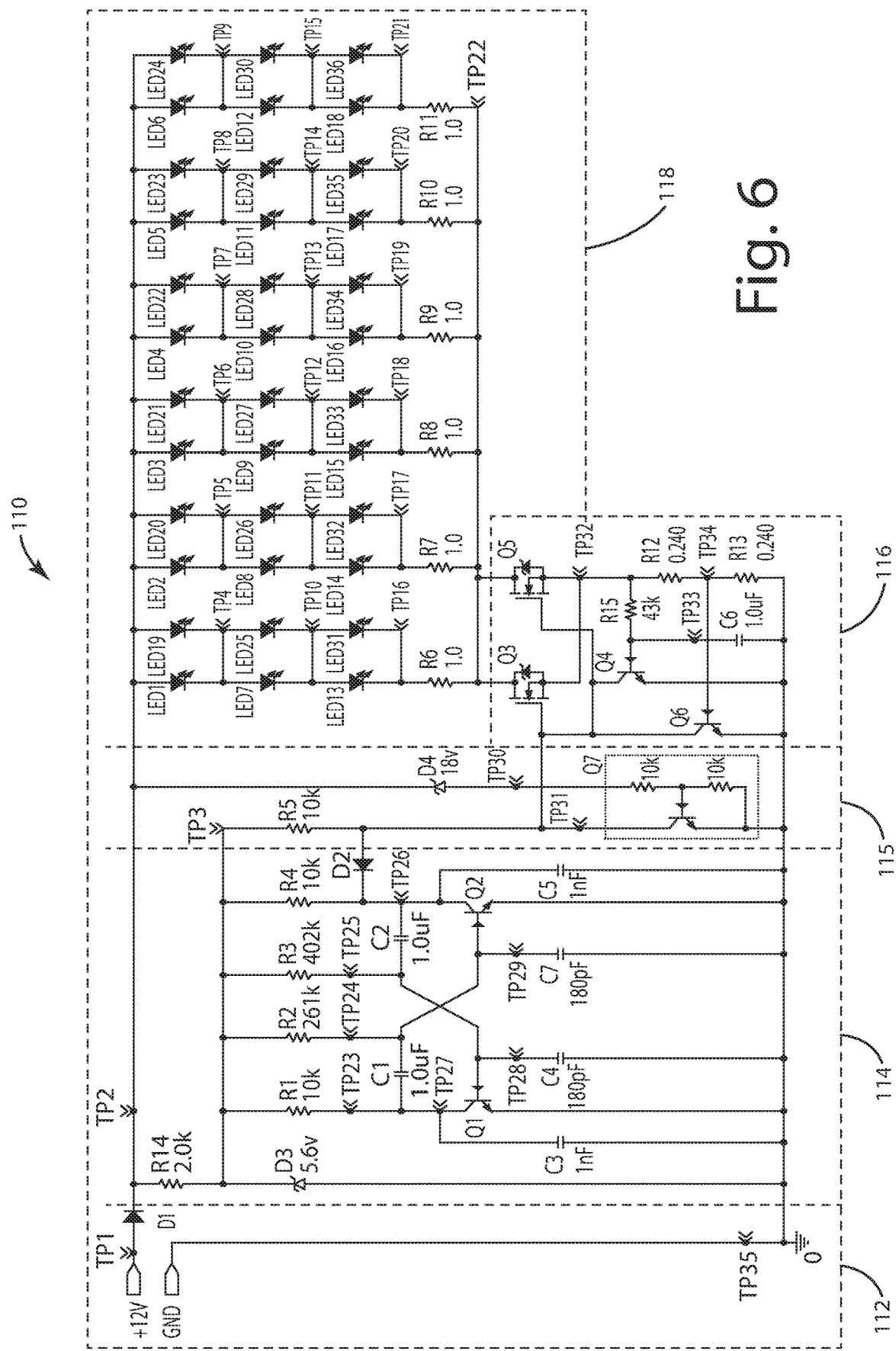
FIG. 6 is a schematic diagram of a flashing lamp circuit in accordance with an alternative embodiment of the present invention.

As illustrated in FIG. 5, the flashing lamp circuit 10 of the current embodiment oscillates the LEDs between a fixed current of 200 mA (milliamps) and 0 mA, and with a duty cycle of 36% "on time" at a frequency of 2.3 Hz (hertz). Of note, the duty cycle is not 50%. The circuit 10 may be tuned to a 50% duty cycle, if desired, or any other value. The circuit 10 can be tuned to achieve a relatively wide range of duty cycles. This ability to adjust the duty cycle is believed to be in distinct contrast to known flashing lamp circuits, which are believed to be limited to a 50% duty cycle.

Alternative Embodiment

A flashing lamp circuit constructed in accordance with an alternative embodiment of the invention is illustrated in FIG.

6 and generally designated 110. The circuit 110 is adapted to be connected to a power supply circuit 112. The circuit 10 includes a multivibrator 114, and over-voltage shutdown circuit 115, a switch/regulator portion 116, and a lamp portion 118.

The power supply circuit 112 is generally similar to the previously described power supply circuit 12. Accordingly, a description of the power supply circuit 112 is not necessary.

The multivibrator 114 is generally similar to the previously described multivibrator 14. Accordingly, a detailed description of the multi-vibrator 114 is not necessary.

The overvoltage shutdown circuit 115 protects the flashing lamp circuit 110 in extreme voltage conditions. The overvoltage shutdown circuit 115 includes the diode D4 and the transistor Q7.

The switch/regulator portion 116 is generally similar to the previously described switch/regulator portion 16. Accordingly, a detailed description of the switch/regulator circuit 116 is not necessary. However, the switch/regulator portion 116 additionally includes the transistor Q4, the resistors R12 and R15, and the capacitor C6 to provide a short pulse at the beginning of each square wave to improve lamp performance.

The LED lamp portion 118 is generally similar to the previously described LED lamp portion 18. Accordingly, a detailed description of the LED lamp portion 118 is not necessary. The LED lamp portion 118 includes thirty-six LEDs LED1 through LED36. The LEDs are arranged in sets of six, with each set connected in series with one of the resistors R6 through R11.

The drawings include nominal values for all of the electrical components. These values are exemplary only. Other values will be known to those skilled in the art. In particular, other values may be selected to produce different functional results. The present invention is not limited to the exemplary values. The embodiments of the flashing lamp circuit provide a duty cycle and a frequency that are dependent on the values of the electrical components.

The above descriptions are those of current embodiments of the invention. Various alterations and changes can be made without departing from the spirit and broader aspects of the invention as defined in the appended claims, which are to be interpreted in accordance with the principles of patent law including the doctrine of equivalents.

This disclosure is illustrative and should not be interpreted as an exhaustive description of all embodiments of the invention or to limit the scope of the claims to the specific elements illustrated or described in connection with these embodiments. For example, and without limitation, any individual element(s) of the described invention may be replaced by alternative elements that provide substantially similar functionality or otherwise provide adequate operation. This includes, for example, presently known alternative elements, such as those that might be currently known to one skilled in the art, and alternative elements that may be developed in the future, such as those that one skilled in the art might, upon development, recognize as alternatives.

Further, the disclosed embodiments include a plurality of features that are described in concert and that might cooperatively provide a collection of benefits. The present invention is not limited to only those embodiments that include all of these features or that provide all of the stated benefits, except to the extent otherwise expressly set forth in the issued claims. Any reference to claim elements in the singular, for example, using the articles "a," "an," "the" or "said," is not to be construed as limiting the element to the singular.

The embodiments of the invention in which an exclusive property or privilege is claimed are defined as follows:

1. A flashing lamp circuit comprising:
   a light source;
   a multivibrator adapted to be connected to a power supply; and
   a switch/regulator circuit operatively connected between the multivibrator and the light source, the switch/regulator circuit including:
   a first transistor having a gate, a source, and a drain, the first transistor source connected to the light source;
   a resistor connected between the first transistor drain and ground;
   a diode connected between the first transistor gate and the multivibrator; and
   a second transistor having a base, a collector, and an emitter, the second transistor collector connected to the first transistor gate, the second transistor base connected to the first transistor drain, the second transistor emitter connected to ground,
   whereby the first transistor acts as an amplifier switch between the multivibrator and the light source, the first transistor further acts as a constant current regulator between the multivibrator and the light source.

2. The flashing lamp circuit as defined in claim 1 wherein the first transistor comprises a MOSFET and the second transistor comprises a BJT.

3. The flashing lamp circuit as defined in claim 1 wherein the multivibrator comprises an astable multivibrator.

4. The flashing lamp circuit as defined in claim 3 wherein the astable multivibrator comprises a dual-BJT astable multivibrator.

5. The flashing lamp circuit as defined in claim 1 wherein the light source comprises at least one LED.

* * * * *